(12) United States Patent
Ma et al.

(10) Patent No.: US 8,970,941 B2
(45) Date of Patent: *Mar. 3, 2015

(54) ANALOG IMOD HAVING A COLOR NOTCH FILTER

(71) Applicant: QUALCOMM MEMS Technologies, Inc., San Diego, CA (US)

(72) Inventors: Jian Ma, Carlsbad, CA (US); Tallis Young Chang, San Diego, CA (US); John Hyunchul Hong, San Clemente, CA (US); Ion Bita, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/312,527

(22) Filed: Jun. 23, 2014

(65) Prior Publication Data

US 2014/0300946 A1 Oct. 9, 2014

Related U.S. Application Data

(63) Continuation of application No. 13/358,769, filed on Jan. 26, 2012, now Pat. No. 8,760,751.

(51) Int. Cl.
*G02B 26/00* (2006.01)
*G02B 26/08* (2006.01)
*H05K 3/10* (2006.01)

(52) U.S. Cl.
CPC .......... *G02B 26/0833* (2013.01); *G02B 26/001* (2013.01); *H05K 3/10* (2013.01)
USPC .............................. 359/290; 359/237; 359/298

(58) Field of Classification Search
USPC ......... 359/290–292, 223–225, 245, 260–263, 359/198, 298, 301–303, 317–318, 237, 242
See application file for complete search history.

(56) References Cited

U.S. PATENT DOCUMENTS 1,877,512 A 9/1932 Hurley
5,835,255 A 11/1998 Miles
(Continued)

FOREIGN PATENT DOCUMENTS

EP 2410368 A1 1/2012
WO WO-9530924 A1 11/1995
(Continued)

OTHER PUBLICATIONS

International Search Report and Written Opinion—PCT/US2013/022581—ISA/EPO—Apr. 17, 2013.
(Continued)

*Primary Examiner* — Dawayne A Pinkney
(74) *Attorney, Agent, or Firm* — Knobbe, Martens, Olson & Bear LLP

(57) ABSTRACT

This disclosure provides systems, methods and apparatus related to an electromechanical display device. In one aspect, an analog interferometric modulator (AIMOD) includes a reflective display pixel having a movable reflective layer and a stationary absorber layer, the reflective layer and absorber layer defining a cavity therebetween. A color notch filter may be employed to produce an improved white state. In some implementations, the color notch filter is positioned on a side of the substrate opposite the absorber layer. In some other implementations, the color notch filter is positioned between the substrate and the movable reflective layer.

25 Claims, 17 Drawing Sheets

(56) References Cited

U.S. PATENT DOCUMENTS

| | | |
|---|---|---|
| 5,838,484 A | 11/1998 | Goossen |
| 6,040,840 A | 3/2000 | Koshiba et al. |
| 6,040,937 A | 3/2000 | Miles |
| 6,674,090 B1 | 1/2004 | Chua et al. |
| 6,674,562 B1 | 1/2004 | Miles |
| 7,119,945 B2 | 10/2006 | Kothari et al. |
| 7,123,216 B1 | 10/2006 | Miles |
| 7,324,176 B2 | 1/2008 | Dunn et al. |
| 7,327,510 B2 | 2/2008 | Cummings et al. |
| 7,733,553 B2 | 6/2010 | Faase et al. |
| 7,872,792 B2 | 1/2011 | Miles |
| 7,876,489 B2 | 1/2011 | Gandhi et al. |
| RE42,119 E | 2/2011 | Chui et al. |
| 7,999,995 B2 | 8/2011 | Hashimura et al. |
| 8,760,751 B2 | 6/2014 | Ma et al. |
| 2007/0058095 A1 | 3/2007 | Miles |
| 2008/0130089 A1 | 6/2008 | Miles |
| 2008/0151347 A1 | 6/2008 | Chui et al. |
| 2009/0244686 A1 | 10/2009 | Djordjev |
| 2011/0090554 A1 | 4/2011 | Tung |
| 2011/0090570 A1 | 4/2011 | Decusatis et al. |
| 2011/0188110 A1 | 8/2011 | Miles |
| 2011/0193770 A1 | 8/2011 | Gally et al. |
| 2011/0286072 A1 | 11/2011 | Liu et al. |
| 2013/0113713 A1 | 5/2013 | Mienko |
| 2013/0135335 A1 | 5/2013 | Govil |

FOREIGN PATENT DOCUMENTS

| | | |
|---|---|---|
| WO | WO-2005076051 A1 | 8/2005 |
| WO | WO-2013081889 A1 | 6/2013 |

OTHER PUBLICATIONS

Written Opinion—PCT/US2013/022581—ISA/EPO—Jan. 23, 2014.

ANALOG IMOD HAVING A COLOR NOTCH FILTER

RELATED APPLICATIONS

This application is a continuation of U.S. patent application Ser. No. 13/358,769, filed Jan. 26, 2012, titled "ANALOG IMOD HAVING A COLOR NOTCH FILTER," now U.S. Pat. No. 8,760,751, which is incorporated by reference herein in its entirety.

TECHNICAL FIELD

This disclosure relates to electromechanical systems and display devices for actively displaying images.

DESCRIPTION OF THE RELATED TECHNOLOGY

Electromechanical systems (EMS) include devices having electrical and mechanical elements, actuators, transducers, sensors, optical components (including mirrors) and electronics. EMS can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography and/or other micromachining processes that etch away parts of substrates and/or deposited material layers, or that add layers to form electrical and electromechanical devices.

One type of EMS device is called an interferometric modulator (IMOD). As used herein, the term IMOD or interferometric light modulator refers to a device that selectively absorbs and/or reflects light using the principles of optical interference. In some implementations, an IMOD may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the IMOD. IMOD devices have a wide range of applications, and are anticipated to be used in improving existing products and creating new products, especially those with display capabilities.

SUMMARY

The systems, methods and devices of the disclosure each have several innovative aspects, no single one of which is solely responsible for the desirable attributes disclosed herein.

One innovative aspect of the subject matter described in this disclosure can be implemented in a device including an analog interferometric modulator (AIMOD). The AIMOD can include a substrate with a first side that is exposed to receive incident light and a second side opposite the first side. A stationary first electrode can be disposed on the second side of the substrate. An optical stack also can be disposed on the second side of the substrate, the optical stack including a broadband absorbing layer. A second electrode can be disposed above the first electrode and the optical stack, such that there is a cavity between the first and second electrodes. A broadband reflective movable layer can be coupled to the second electrode, the movable layer configured to move to at least three different positions relative to the optical stack in response to a voltage applied across the first electrode and the second electrode. A notch filter can be located on the same side of the movable layer as the optical stack and the substrate, the notch filter being spaced apart from the movable layer and configured to at least partially absorb light having a wavelength between about 400 nm and about 600 nm.

In some implementations, the movable layer can include a metal reflector and one or more dielectric layers disposed on the surface of the metal reflector facing the broadband absorbing layer. In some implementations, the notch filter can be disposed between the first electrode and the substrate. In some implementations, the notch filter can be disposed between the first electrode and the cavity. In some implementations, the device can further include a cover glass disposed such that the substrate is between the cover glass and the movable layer, the cover glass including the notch filter. In some implementations, the notch filter can include at least one of: a thin film dye, a plurality of metal nanoparticles, a Rugate filter, and a holographic filter. In some implementations, the movable layer can be configured to be positionable at a first distance from the optical stack such that light reflected by the movable layer and the optical stack appears substantially white. The notch filter can be positioned to receive incident light and receive the light reflected from the movable layer and the optical stack appears substantially white. The notch filter can be positioned to receive incident light and receive the light reflected from the movable layer, and to at least partially absorb light having a wavelength between about 400 nm and about 600 nm. In some implementations, the notch filter can be configured to decrease a difference in chromaticity between the reflective color of the AIMOD and that of illuminant D65, when the movable layer is positioned at a first distance from the optical stack that produces a broadband reflection of light having a substantially white appearance. In some implementations, this distance can be between about 0 nm and about 20 nm.

Another innovative aspect of the subject matter described in this disclosure can be implemented in a device including a means for modulating light. The light modulating means can include a substrate having a first side that is exposed to receive incident light and a second side opposite the first side. The light modulating means also can include a first means for conducting electrostatic charge, the first conducting means disposed on the second side of the substrate. A first means for absorbing light also can be disposed on the second side of the substrate. A second means for conducting electrostatic charge can be positioned above the first conducting means and the first absorbing means, such that there is a cavity between the second conducting means and the first conducting means. A means for reflecting light can be coupled to the second conducting means, the reflecting means configured to move to at least three different positions relative to the first absorbing means in response to a voltage applied across the first conducting means and the second conducting means. A second means for absorbing light can be located on the same side of the reflecting means as the substrate, the second absorbing means being spaced apart from the reflecting means and configured to at least partially absorb light having a wavelength between about 400 nm and about 600 nm.

Another innovative aspect of the subject matter described in this disclosure can be implemented in a method of manufacturing a device. The method includes providing a substrate having a first side that is exposed to receive incident light and a second side opposite the first side. The method further includes disposing a stationary first electrode on the second side of the substrate, and disposing an optical stack on the second side of the substrate, the optical stack including a broadband absorbing layer. The method further includes disposing a sacrificial layer above the first electrode and the optical stack, and disposing a reflective movable layer and a second electrode above the first electrode and the optical stack. The method further includes forming a cavity between the second electrode and the first electrode, the movable layer configured to move in the cavity to at least three different positions relative to the optical stack in response to a voltage applied across the first electrode and the second electrode. The method further includes disposing a notch filter on the same side of the movable layer as the substrate, the notch filter being spaced apart from the movable layer and configured to at least partially absorb light having a wavelength between about 400 nm and about 600 nm. In some implementations, disposing the notch filter can include arranging the notch filter between the first electrode and the substrate. In some implementations, the method can further include disposing a cover glass over the first side of the substrate, and disposing the notch filter can include arranging the notch filter on the cover glass.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
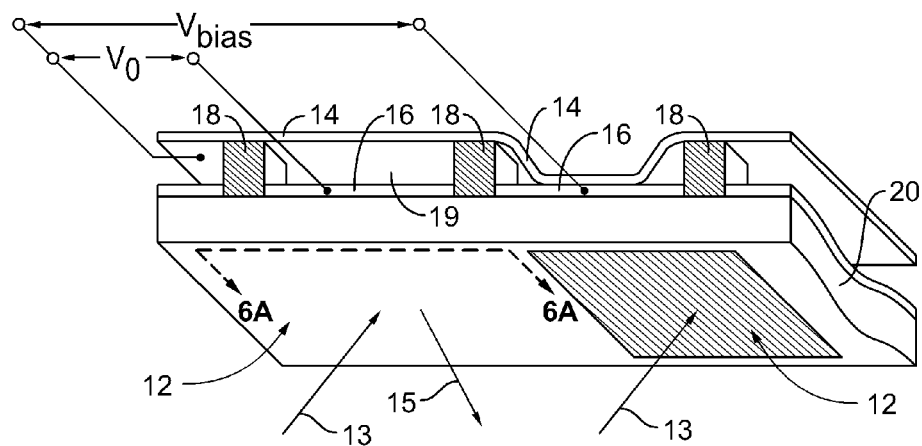
FIG. 1 shows an example of an isometric view depicting two adjacent pixels in a series of pixels of an interferometric modulator (IMOD) display device.

The following description is directed to some implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Each pixel in an analog IMOD (AIMOD) can be configured to reflect more colors than a bi-stable IMOD. For example, the relative positions of the reflective layer and the absorber may be modified to reflect red, green, blue and white. Any particular wavelength can be maximally reflected by controlling the distance between the reflective layer and the absorbing layer. A high percentage of reflection, or a maximum reflection, can be achieved when this distance is such that the light reflected off the top surface of the reflective layer interferes constructively within the gap between the reflective layer and the absorbing layer. At this distance, the absorber is located at the minimum light intensity of the interference standing waves. For example, an AIMOD can reflect the maximum amount of light when the relative position of the reflective layer and the absorber are configured in the white state. The required distance for maximum reflection is different for different wavelengths. In some implementations, the optimum distance that reflects both the short wavelength (blue) and long wavelength (red) is a distance somewhere in the middle. As a result, the white state of many AIMODs may produce a white with a tint of a color in the middle of that wavelength spectrum, such as a greenish tint. In other words, green is sometimes reflected more strongly from the AIMOD than red or blue, resulting in an imperfect white appearance. Existing solutions to this problem include spatial dithering and temporal modulation techniques that modulates the intensity of the tinted white and other colors and mixes them through spatial dithering to synthesize a more true white according to the principle of additive color mixing. This approach, however, can reduce luminance, sacrifice spatial resolution and/or use additional processing and electric power. This disclosure relates to a new solution to this problem. In various implementations, a color notch filter is employed in the light path of an AIMOD, modifying the spectrum of the reflected color of the AIMOD to compensate for the greenish tent. Accordingly, the difference between the reflected spectrum of the white state may be made to correspond more closely to "true" white in appearance, and as measured and relative to a desired white point.

Particular implementations of the subject matter described in this disclosure can be implemented to realize one or more of the following potential advantages. AIMODs are often unable to produce a reflected color that is sufficiently close to true white. By utilizing a color notch filter in conjunction with an AIMOD, the benefits of an AIMOD are mostly maintained, while the drawback of a tinted white is reduced. Since little-to-no spatial dithering and/or temporal modulation is needed to display the white color, the drawbacks associated with spatial dithering and temporal modulation can mostly be avoided. And because white is often the most dominant color in a display (such as an e-reader device), such an improvement is significant.

An example of a suitable MEMS or EMS device, to which the described implementations may apply, is a reflective display device. Reflective display devices can incorporate IMODs to selectively absorb and/or reflect light incident thereon using principles of optical interferometric absorption. IMODs can include an absorber and a reflector that is movable with respect to the absorber. The reflector can be moved to two or more different positions that change the locations of the absorber with respect to standing wave field intensity spatial distribution of different wavelengths, which changes the absorption spectrum and thereby affect the reflectance spectrum of the IMOD. The reflection spectrum can be adjusted by changing the relative position between the reflector and the absorber, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when actuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent IMODs 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows indicating light 13 incident upon the pixels 12, and light 15 reflecting from the pixel 12 on the left. Although not illustrated in detail, it will be understood by a person having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
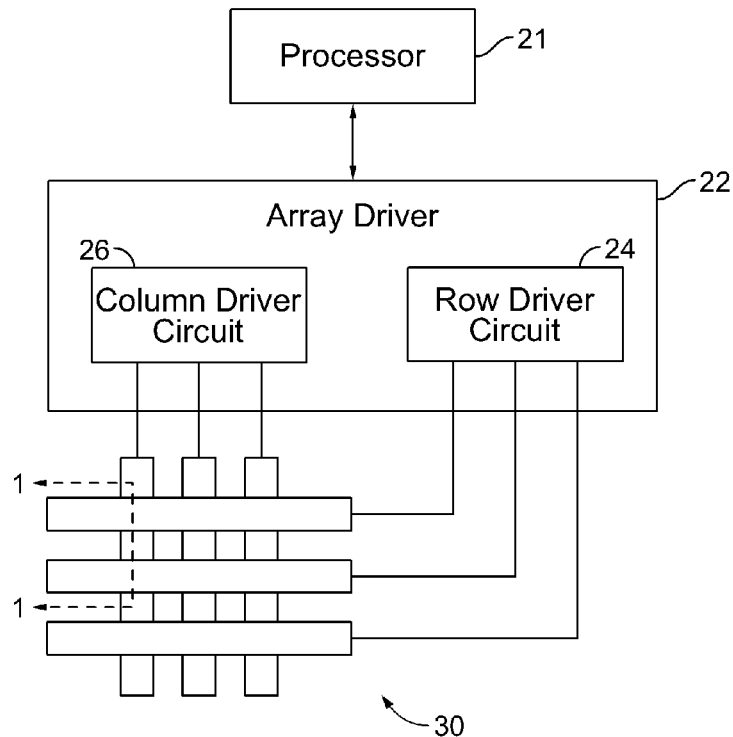
FIG. 2 shows an example of a system block diagram illustrating an electronic device incorporating a 3×3 IMOD display.

FIG. 2 shows an example of a system block diagram illustrating an electronic device incorporating a 3×3 IMOD display. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
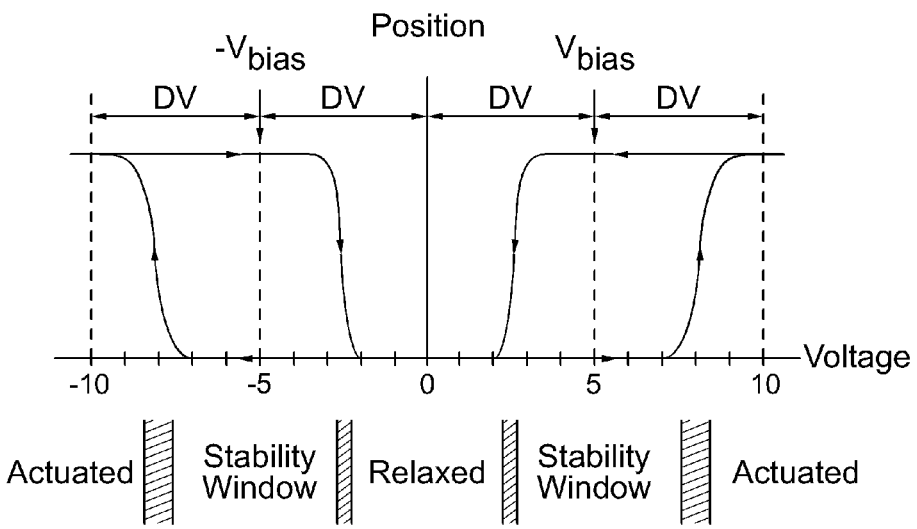
FIG. 3 shows an example of a diagram illustrating movable reflective layer position versus applied voltage for the IMOD of FIG. 1.
FIG. 4 shows an example of a table illustrating various states of an IMOD when various common and segment voltages are applied.

FIG. 3 shows an example of a diagram illustrating movable reflective layer position versus applied voltage for the IMOD of FIG. 1. For MEMS IMODs, the row/column (i.e., common/segment) write procedure may take advantage of a hysteresis property of these devices as illustrated in FIG. 3. An IMOD may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10-volts, however, the movable reflective layer does not relax completely until the voltage drops below 2-volts. Thus, a range of voltage, approximately 3 to 7-volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10-volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7-volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an IMOD when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all IMOD elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the IMOD will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
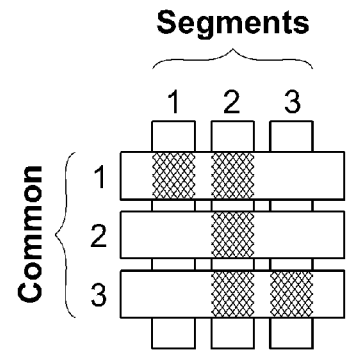
FIG. 5A shows an example of a diagram illustrating a frame of display data in the 3×3 IMOD display of FIG. 2.
Figure 5B:
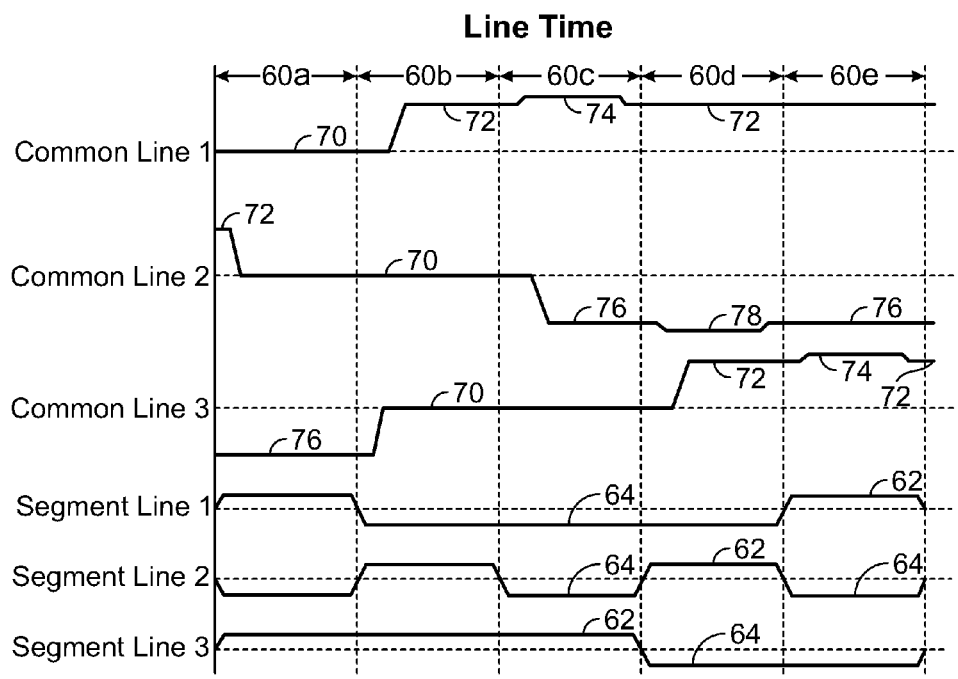
FIG. 5B shows an example of a timing diagram for common and segment signals that may be used to write the frame of display data illustrated in FIG. 5A.

FIG. 5A shows an example of a diagram illustrating a frame of display data in the 3×3 IMOD display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the IMODs, as none of common lines 1, 2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
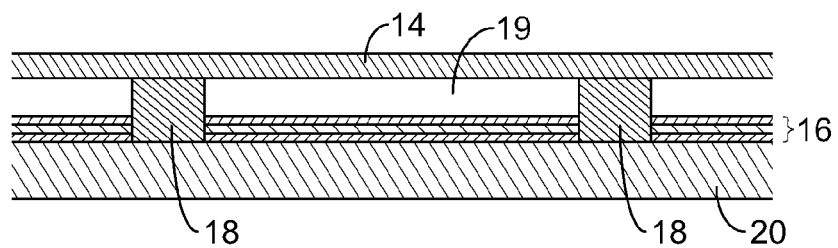
FIG. 6A shows an example of a partial cross-section of the IMOD display of FIG. 1.
Figure 6B:
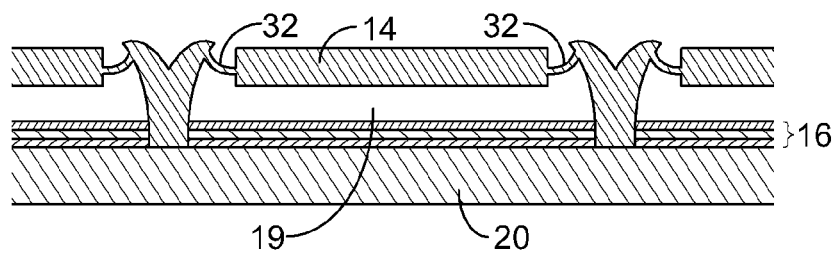
FIGS. 6B-6E show examples of cross-sections of varying implementations of IMODs including the movable layer and its supporting structure.
Figure 6C:
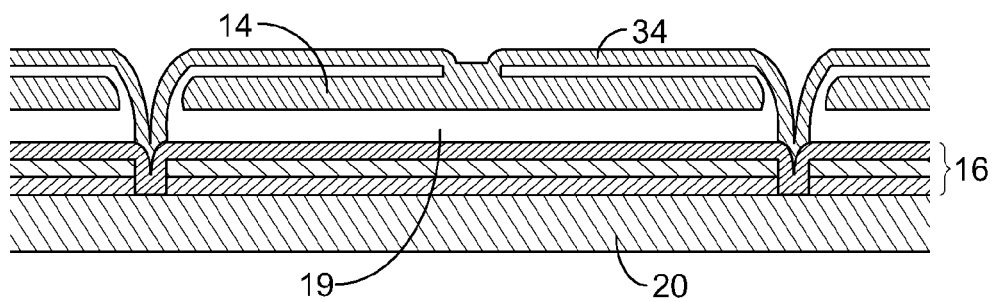

The details of the structure of IMODs that operate in accordance with the principles set forth above may vary widely. For example, FIGS. 6B-6E show examples of cross-sections of varying implementations of IMODs, including the movable reflective layer 14 and its supporting structures. FIG. 6A shows an example of a partial cross-section of the IMOD display of FIG. 1. A strip of metal material, i.e., the movable reflective layer 14, is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
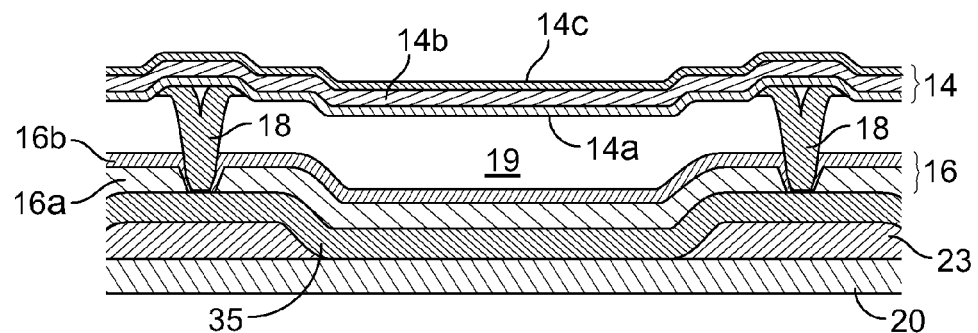

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, e.g., an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a layer and an aluminum alloy that serves as a reflector and a bussing layer, with a thickness in the range of about 30-80 Å, 500-1000 Å and 500-6000 Å, respectively. The one or more layers can be patterned using a variety of techniques, including photolithography and dry etching, including, for example, carbon tetrafluoride ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
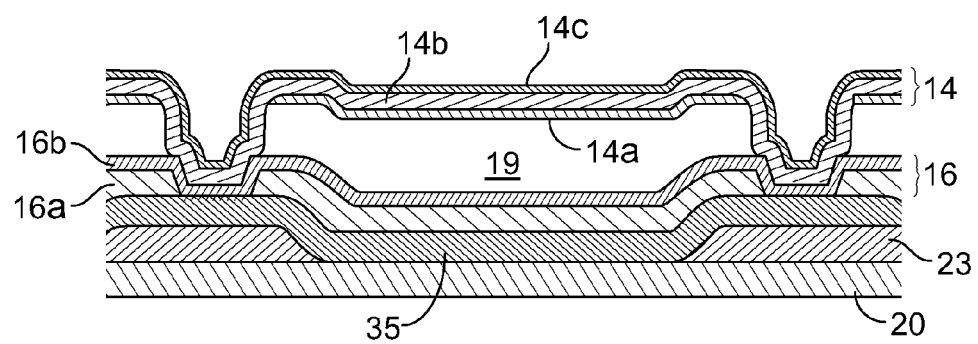

FIG. 6E shows another example of an IMOD, where the movable reflective layer 14 is self-supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the IMOD is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as patterning.

Figure 7:
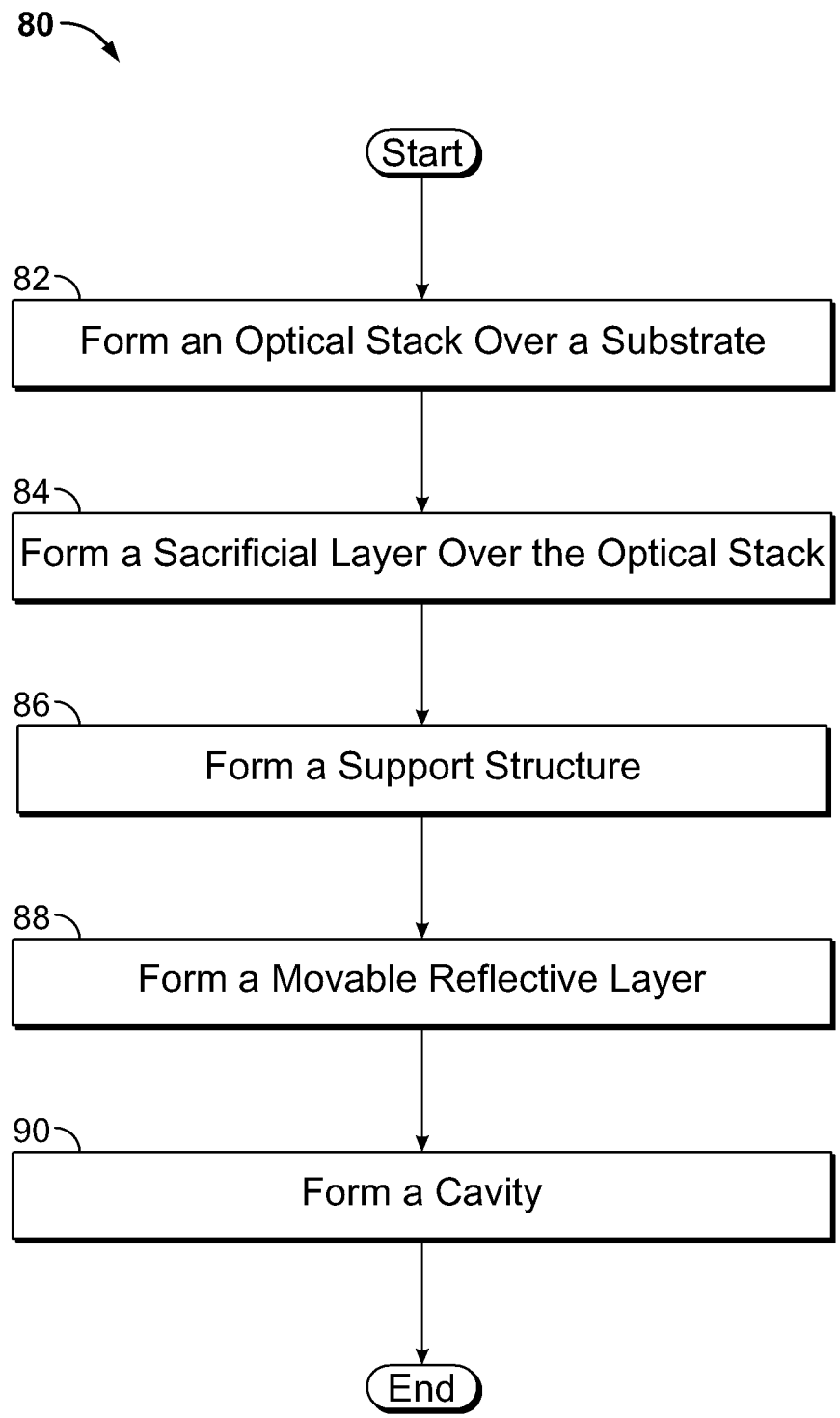
FIG. 7 shows an example of a flow diagram illustrating a manufacturing process for an IMOD.
Figure 8A:
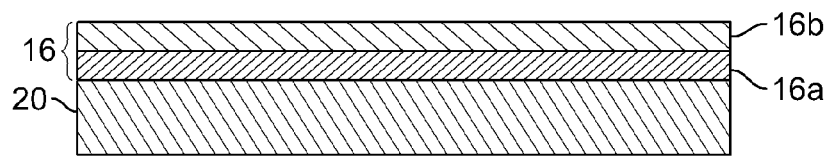
FIGS. 8A-8E show examples of cross-sectional schematic illustrations of various stages in a method of making an IMOD.

FIG. 7 shows an example of a flow diagram illustrating a manufacturing process 80 for an IMOD. FIGS. 8A-8E show examples of cross-sectional schematic illustrations of various stages in a method of making an IMOD. In some implementations, the manufacturing process 80 can be implemented to manufacture, e.g., IMODs of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
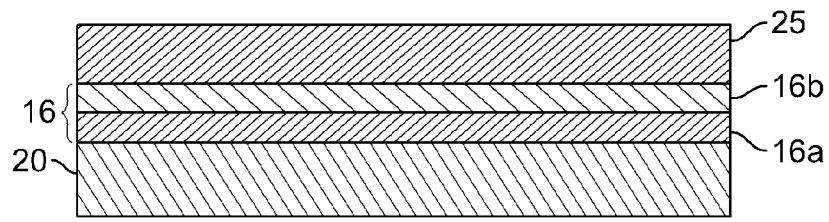

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting IMODs 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (a-Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
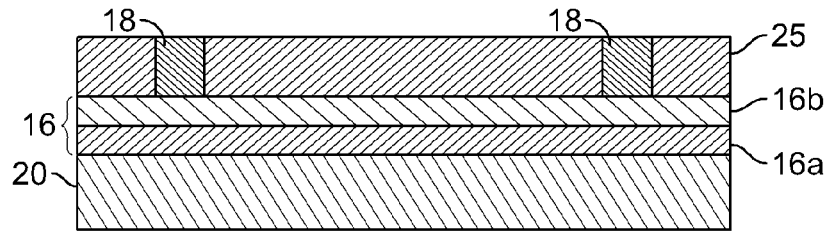

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
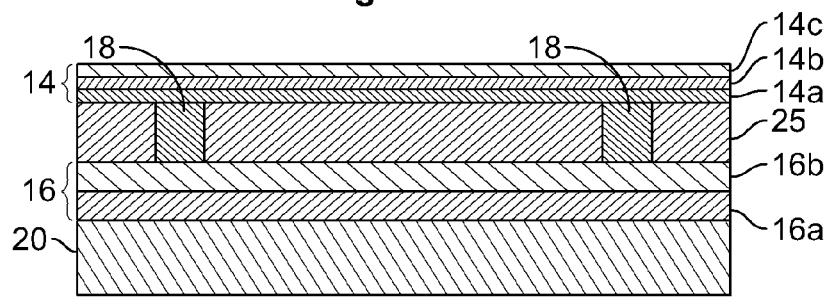
Figure 8E:
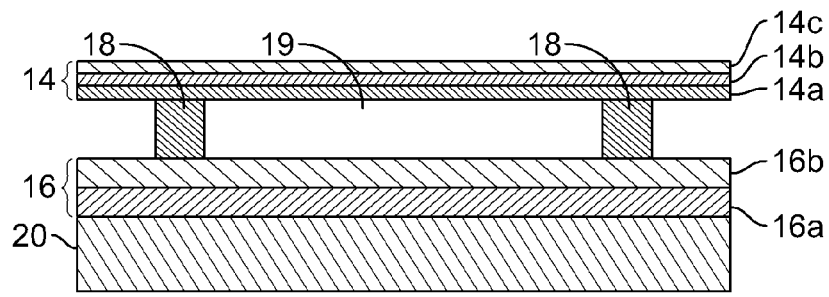

The process 80 continues at block 88 with the formation of a movable reflective layer or membrane such as the movable reflective layer 14 illustrated in FIGS. 1, 6 and 8D. The movable reflective layer 14 may be formed by employing one or more deposition steps, e.g., reflective layer (e.g., aluminum, aluminum alloy) deposition, along with one or more patterning, masking and/or etching steps. The movable reflective layer 14 can be electrically conductive, and referred to as an electrically conductive layer. In some implementations, the movable reflective layer 14 may include a plurality of sub-layers 14a, 14b and 14c as shown in FIG. 8D. In some implementations, one or more of the sub-layers, such as sub-layers 14a and 14c, may include highly reflective sub-layers selected for their optical properties, and another sub-layer 14b may include a mechanical sub-layer selected for its mechanical properties. Since the sacrificial layer 25 is still present in the partially fabricated IMOD formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Figure 9:
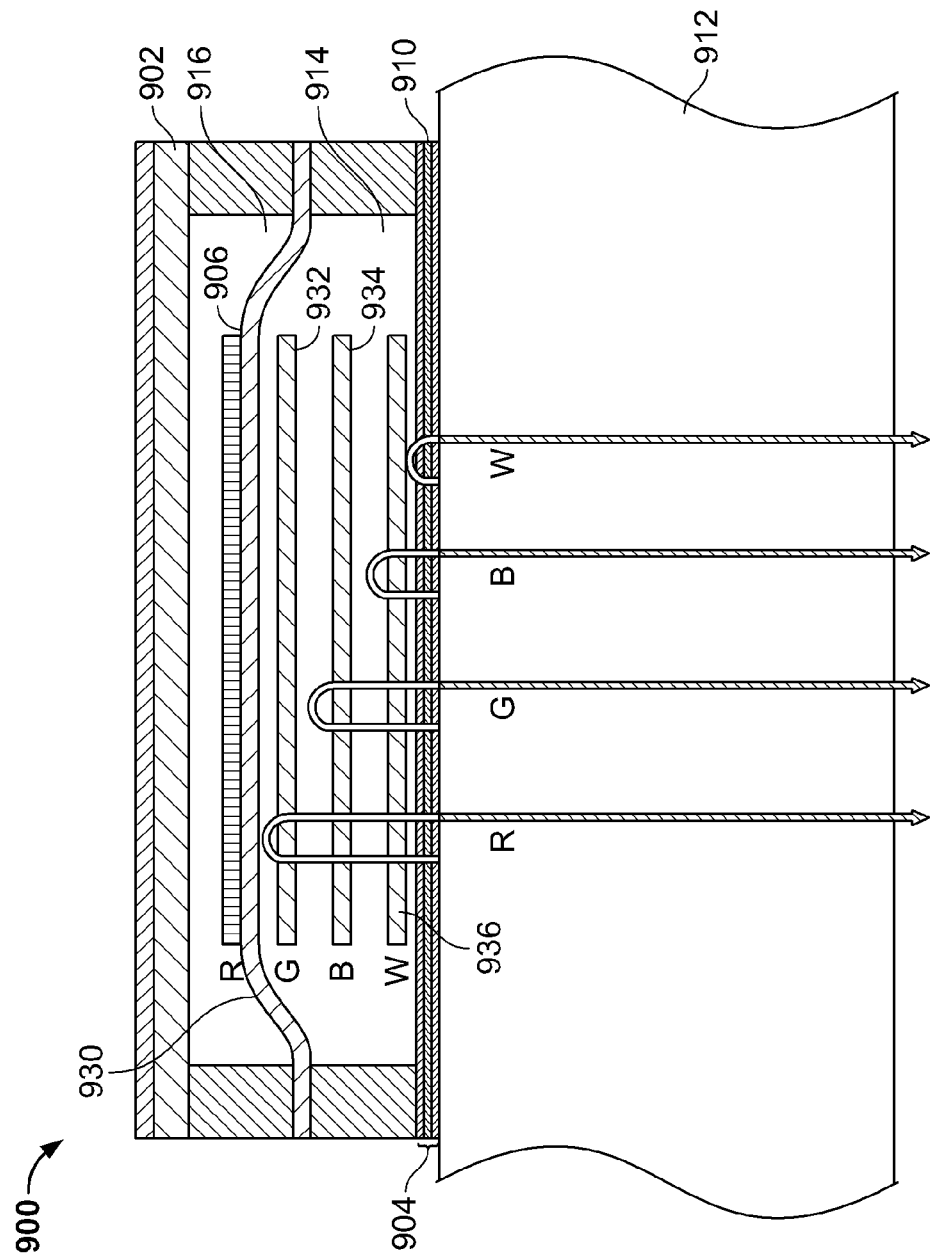
FIGS. 9 and 10 show examples of a cross-section of an analog IMOD (AIMOD).
Figure 10:
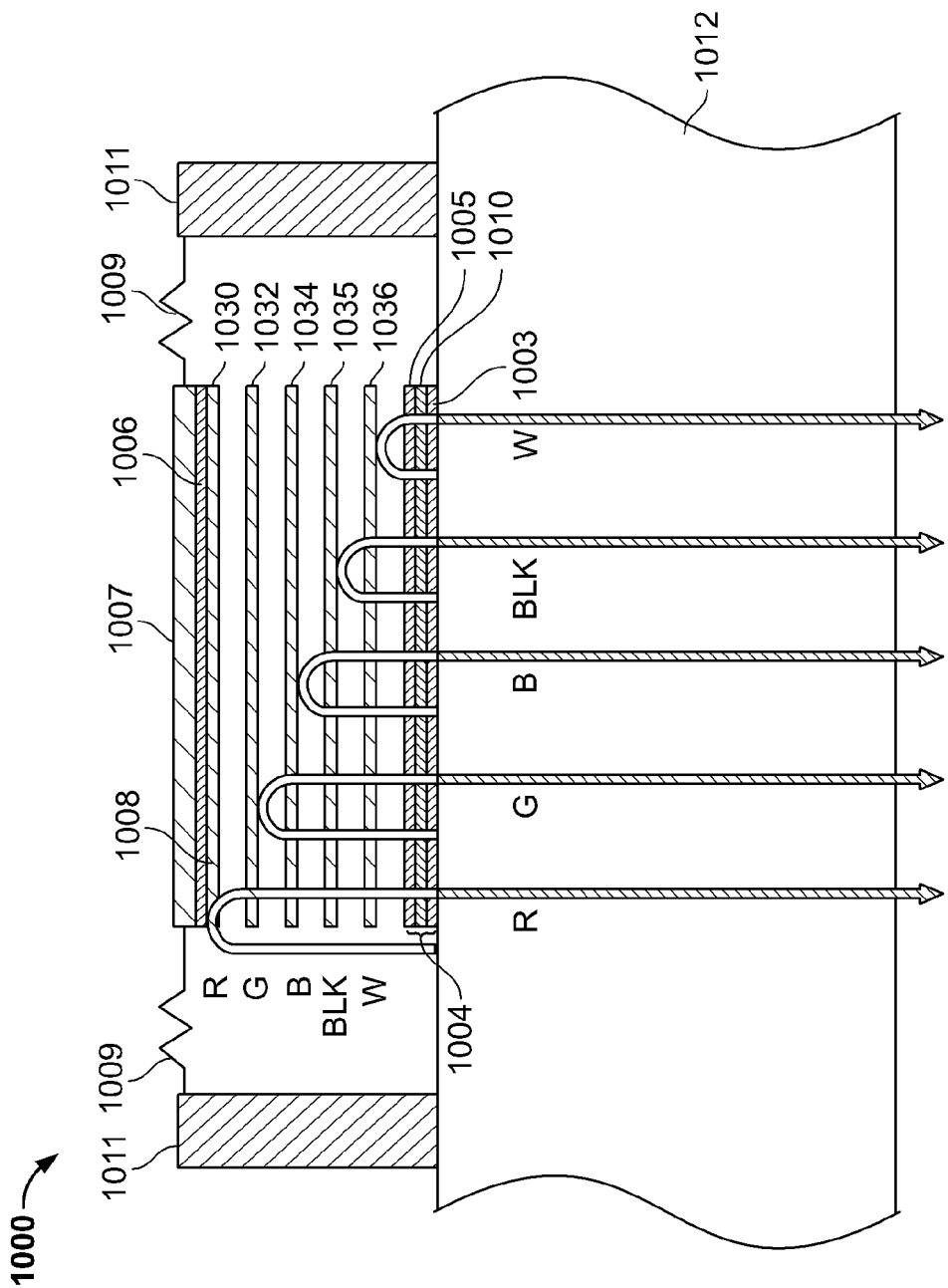

FIGS. 9 and 10 show examples of a cross-section of an analog IMOD (AIMOD). With reference to FIG. 9, the AIMOD 900 includes a substrate 912 and an optical stack 904 disposed over the substrate 912. The AIMOD includes a first electrode 910 and a second electrode 902 (as illustrated, the first electrode 910 is a lower electrode, and second electrode 902 is an upper electrode). The AIMOD 900 also includes a movable reflective layer 906 disposed between the first electrode 910 and the second electrode 902. In some implementations, the optical stack 904 includes an absorbing layer, and/or a plurality of other layers, and can be configured similar to the optical stack 16 illustrated in FIGS. 16A-6E. In some implementations, and in the example illustrated in FIG. 9, the optical stack 904 includes the first electrode 910 which is configured as an absorbing layer. In such a configuration, the absorbing layer (first electrode 910) can be an approximately 6 nm layer of material that includes MoCr. In some implementations, the absorbing layer (i.e., the first electrode 910) can be a layer of material including MoCr with a thickness ranging from approximately 2 nm to 10 nm.

Still referring to FIG. 9, the reflective layer 906 can be provided with a charge. The reflective layer is configured to, once charged, move toward either the first electrode 910 or the second electrode 902 when a voltage is applied between the first and second electrodes 910 and 902. In this manner, the reflective layer 906 can be driven through a range of positions between the two electrodes 902 and 910, including above and below a relaxed (unactuated) state. For example, FIG. 9 illustrates that the reflective layer 906 can be moved to various positions 930, 932 and 934 and 936 between the first electrode 910 and the second electrode 902.

The AIMOD 900 can be configured to selectively reflect certain wavelengths of light depending on the configuration of the AIMOD. The distance between the first electrode 910, which in this implementation acts as an absorbing layer, and the reflective layer 906 changes the reflective properties of the AIMOD 900. Any particular wavelength is maximally reflected from the AIMOD 900 when the distance between the reflective layer 906 and the absorbing layer (first electrode 910) is such that the absorbing layer (first electrode 910) is located at the minimum light intensity of standing waves resulting from interference between incident light and light reflected from the reflective layer 906. For example, as illustrated, the AIMOD 900 is designed to be viewed from the substrate 912 side of the AIMOD (through the substrate 912), i.e., light enters the AIMOD 900 through the substrate 912. Depending on the position of the reflective layer 906, different wavelengths of light are reflected back through the substrate 912, which gives the appearance of different colors. These different colors are also known as native colors.

A position of a movable layer(s) of a display element (e.g., an AIMOD) at a location such that it reflects a certain wavelength or wavelengths can be referred to a display state. For example, when the reflective layer 906 is in position 930, red wavelengths of light are reflected in greater proportion than other wavelengths and the other wavelengths of light are absorbed in greater proportion than red. Accordingly, the AIMOD 900 appears red and is said to be in a red display state, or simply a red state. Similarly, the AIMOD 900 is in a green display state (or green state) when the reflective layer 906 moves to position 932, where green wavelengths of light are reflected in greater proportion than other wavelengths and the other wavelengths of light are absorbed in greater proportion than green. When the reflective layer 906 moves to position 934, the AIMOD 900 is in a blue display state (or blue state) and blue wavelengths of light are reflected in greater proportion than other wavelengths and the other wavelengths of light are absorbed in greater proportion than blue. When the reflective layer 906 moves to a position 936, the AIMOD 900 is in a white display state (or white state) and a broad range of wavelengths of light in the visible spectrum are substantially reflected such that the AIMOD 900 appears "white" or in some cases "silver," depending on the total reflection (or luminance) from the reflector. In some cases increased total reflection (or luminance) can be achieved with the addition of dielectric layers disposed on the metal reflector, thereby displaying a white state. However, the white can be tinted with blue, green or yellow, depending on the exact position of 936. In some implementations, in position 936, configured to produce a white state, the distance between the reflective layer 906 and the first electrode 910 is between about 0 and 20 nm. It should be noted that one of ordinary skill in the art will readily recognize that the AIMOD 900 can take on different states and selectively reflect other wavelengths of light based on the position of the reflective layer 906, and also based on materials that are used in construction of the AIMOD 900, particularly various layers in the optical stack 904.

The AIMOD 900 in FIG. 9 has two structural cavities, a first cavity 914 between the reflective layer 906 and the optical stack 904, and a second cavity 916 between the reflective layer 906 and the second electrode 902. However, because the reflective layer 906 is reflective and not transmissive, light does not propagate through the reflective layer 906 into the second cavity 916. In addition, the color and/or intensity of light reflected by the AIMOD 900 is determined by the distance between the reflective layer 906 and the absorbing layer (first electrode 910). Accordingly, the AIMOD 900 illustrated in FIG. 9 has one interferometric (absorbing) cavity 914. In contrast, incident light which entered the first cavity 914 does not enter the second cavity 916.

FIG. 10 shows an example of a cross-section of an analog IMOD (AIMOD) according to another implementation. The AIMOD 1000 includes a reflective layer 1006 positioned above a first electrode 1010 that is also an absorbing layer in an optical stack 1004, which can include dielectric layers 1003 and 1005 positioned over and beneath the first electrode 1010. 1003 can include more than one layer; likewise, 1005 also can include more than one layer. In some implementations, and in the example illustrated in FIG. 10, the reflective layer 1006 can function as a second electrode. In some other implementations, a separate electrode structure may be formed under or over the reflective layer 1006. In some implementations, the reflective layer 1006 can include aluminum (Al). In some other implementations, different reflective materials may be used. The optical stack 1004 also can include an absorbing layer that is not an electrode, and/or a plurality of other layers. In some implementations, and in the example illustrated in FIG. 10, the first electrode 1010 is configured as the absorbing layer. The absorbing layer can be, for example, a 6 µm layer of material that includes MoCr. The reflective layer 1006 may be covered with one or more dielectric layers 1008 positioned between the reflective layer 1006 and the optical stack 1004. The function of the dielectric layer 1008 is to establish the first null of a standing wave in the cavity at a distance of between 0-20 nm from the surface of the reflective layer 1006. The dielectric layer 1008 also can reduce the separations of the first nulls of different wavelengths for improving the brightness of the white state. The reflective layer 1006 can be mounted onto a mechanical layer 1007, which is in turn attached to hinges 1009. The hinges 1009 are in turn connected to posts 1011 on either side of the mechanical layer 1007. The hinges 1009 provide support for the mechanical layer 1007, reflective layer 1006 and the dielectric layer 1008, while still permitting movement of these layers in response to an applied voltage between the first electrode 1010 and reflective layer 1006, which may serve as a second electrode 1006.

With continuing reference to FIG. 10, the reflective layer 1006 can be provided with a charge. The reflective layer is configured to, once charged, move toward the first electrode 1010 that is connected to ground. In this manner, the reflective layer 1006 can be driven through a range of positions relative to the first electrode 1010. For example, FIG. 10 illustrates the reflective layer 1006 can be moved to various positions 1030, 1032, 1034, 1035 and 1036 relative to the first electrode 1010.

As discussed with respect to FIG. 9, the AIMOD 1000 can be configured to selectively reflect certain wavelengths of light depending on the configuration of the AIMOD. The distance between the first electrode 1010, which in this implementations acts as an absorbing layer, and the reflective layer 1006 changes the reflective properties of the AIMOD 1000.

Any particular wavelength can be maximally reflected by controlling the distance between the reflective layer 1006 and the absorbing layer first electrode 1010. A high percentage of reflection, or a maximum reflection, can occur when the distance is such that the light reflected off the top surface of the reflective layer 1006 interferes constructively within the gap between the reflective layer 1006 and the absorbing layer. At this distance, the absorbing layer (first electrode 1010) is located at the minimum light intensity of the interference standing waves.

For example, the AIMOD 1000 of FIG. 10 is designed to be viewed on the substrate 1012 side of the AIMOD. Light enters the AIMOD 1000 through the substrate 1012. Depending on the position of the reflective layer 1006, different wavelengths of light are reflected back through the substrate 1012, which gives the appearance of different colors. These different colors are also known as native colors. A position of a movable layer of a display element (e.g., an AIMOD) at a location such that it reflects a certain wavelength or wavelengths can be referred to a display state. For example, when the reflective layer 1006 is in position 1030, red wavelengths of light are substantially reflected and other wavelengths of light are substantially absorbed by the first electrode 1010 (the absorbing layer). Accordingly, the AIMOD 1000 appears red and is said to be in a red state or a red display state. Similarly, the AIMOD 1000 is in a green display state (or green state) when the reflective layer 1006 moves to position 1032, where green wavelengths of light are substantially reflected and other wavelengths of light are substantially absorbed. When the reflective layer 1006 moves to position 1034, the AIMOD 1000 is in a blue display state (or blue state) and blue wavelengths of light are substantially reflected and other wavelengths of light are substantially absorbed. When the reflective layer 1006 moves to a position 1035, the AIMOD 1000 is in a black display state (or black state) and a broad range of wavelengths of light in the visible spectrum are substantially absorbed, and visible reflections are thereby minimized, such that the AIMOD 1000 appears "black." When the reflective layer 1006 moves to a position 1036, the AIMOD 1000 is in a white display state (or white state) and a broad range of wavelengths of light in the visible spectrum are substantially reflected such that and the AIMOD 1000 appears "white." In some implementations, in position 1036, configured to produce a white state, the distance between the reflective layer 1006 and the first electrode 1010 is between about 0 and 20 nm.

In an IMOD display element, the display element's reflective color is determined by the gap spacing between the thin absorbing metal layer and a mirror surface. To produce a white appearance with high brightness, reflections of all wavelengths in the visible spectrum is desired. To achieve high brightness, a reflective layer (e.g., 1006 in FIG. 10) can have one or more dielectric layers (e.g., 1008 in FIG. 10) disposed on the surface of the reflective layer. In this configuration, the first null of the interference standing wave can be located in the cavity near the surface of the reflective layer. In a white state, the reflective layer is moved in close proximity to the absorbing layer (e.g., 1010 in FIG. 10), for example at a distance of about 0-20 nm, such that the absorbing layer is positioned at the null of the standing wave. One problem, however, is that the locations of the nulls of different wavelengths are not exactly the same; therefore, the required spacing for maximum reflection is different for different wavelengths. The optimum spacing that reflects both the short wavelength (blue) and long wavelength (red) is a spacing somewhere in the middle. As a result, the white state of many AIMODs may produce a white with greenish tint. In other words, green is reflected more strongly from the AIMOD than red or blue, resulting in an imperfect white appearance. It will be understood that although greenish tint is common, other configurations produce a white state with a bluish tint or yellowish tint, and other similar deviations from true white are possible. Existing solutions to this problem involve a pixel dithering technique that mixes the tinted white with other colors to synthesize a more true white. This approach, however, can reduce luminance, sacrifice spatial resolution and consume additional processing and electric power.

To address this problem, a color notch filter can be employed to modify the reflected color of the AIMOD in order to minimize the greenish tint. An aim is to minimize the difference between the reflected spectrum of the white state with that of illuminant D65, an industry standard power spectrum of white color for electronic displays, e.g., an LCD display. Although any suitable type of color notch filter may be used, the configuration of such a filter is such that it specifically filters the wavelengths desired for such AIMOD display elements. The notch filter can include, but is not limited to, a filter including thin film dyes, metal nanoparticles, Rugate filters, holograph notch filters, or any other technology that allows for selective filtering to achieve the desired amount of power of a specific spectrum.

Figure 11A:
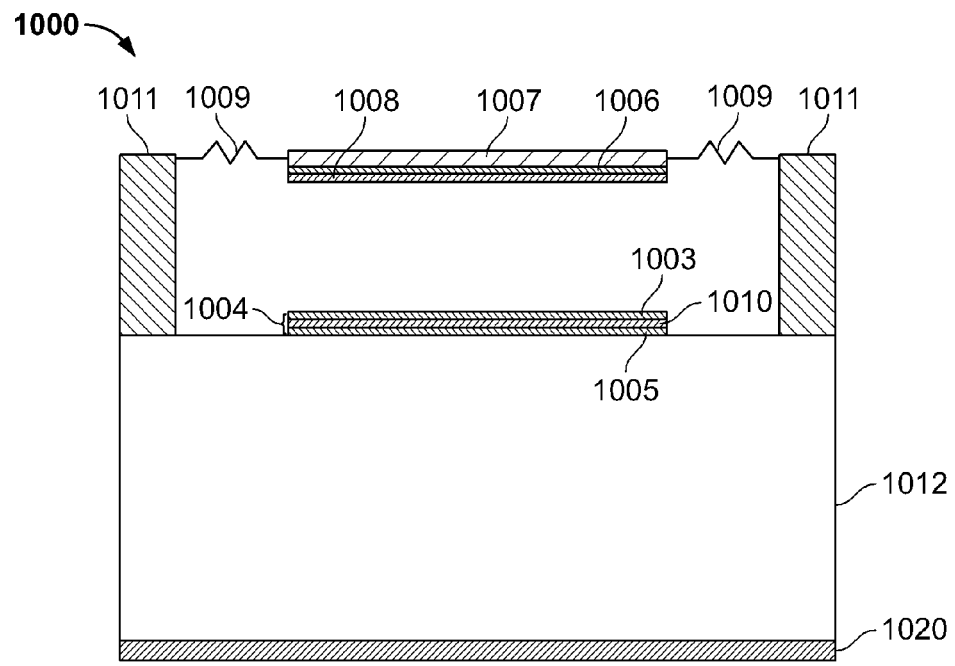
FIGS. 11A and 11B show example of a cross-sections of AIMODs with notch filters.
Figure 11B:
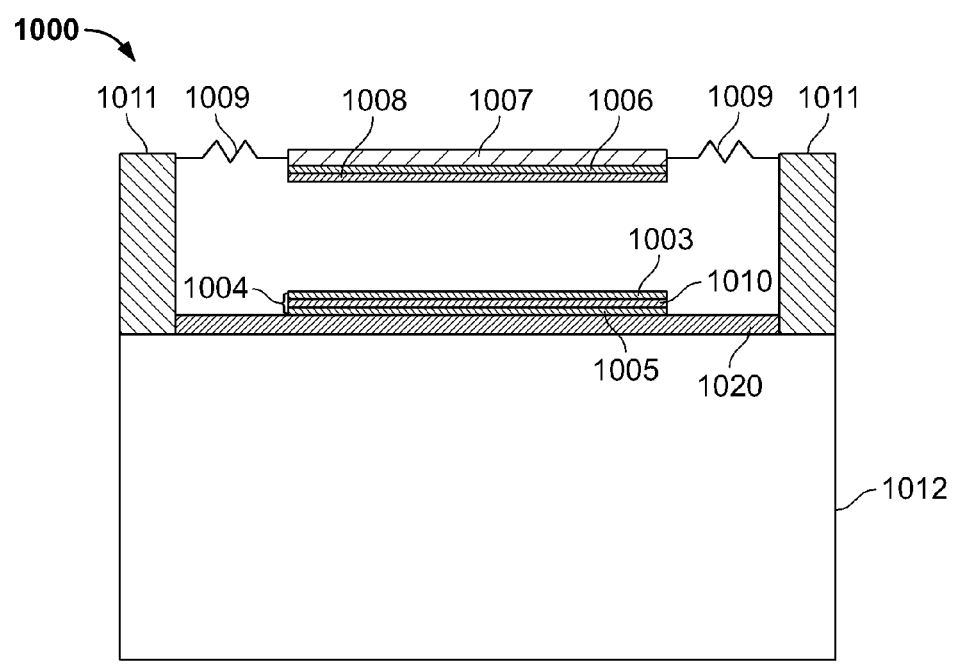

FIGS. 11A and 11B show example of cross-sections of analog IMODs with notch filters. With reference to FIG. 11A, analog IMOD (AIMOD) 1000 is configured similar to that shown in FIG. 10. In this implementation, however, a color notch filter 1020 is arranged on the side of substrate 1012 opposite the absorbing layer 1010. By positioning the color notch filter 1020 over the substrate, light going through the filter will be filtered according to the property of the filter; as such, the spectrum of the light reflected from the AIMOD according to the principles above will be modified. Although the color notch filter 1020 is illustrated as extending over the entire surface of the substrate, it will be understood that other configurations are possible. For example, in some implementations, the color notch filter 1020 can be arranged to cover only those areas of the substrate 1020 that are directly aligned with the active display region of the AIMOD 1000. In some implementations, a cover glass may be applied over the color notch filter 1020. In other implementations, the color notch filter 1020 may be integrated with and included within the cover glass. FIG. 11B also shows an AIMOD 1000 similar to that shown in FIG. 11A. In FIG. 11B, however, the color notch filter 1020 is arranged in between the substrate 1012 and the optical stack 1004 that includes the absorbing layer 1010. Although the color notch filter 1020 is illustrated as extending between each post 1011, it will be understood that other configurations are possible. For example, in some implementations, the color notch filter 1020 may be coextensive with the optical stack 1004. In other configurations, the color notch filter 1020 may extend over an area even smaller than the optical stack 1004. In some implementations, the color notch filter 1020 may be integrated within the optical stack 1004, for example by replacing one of the dielectric layers 1003 and 1005. In each of the implementations illustrated in FIGS. 11A and 11B, the color notch filter may be employed to improve performance of the white state of the AIMOD. By selecting or tuning the color notch filter 1020 appropriately, a more true white state can be achieved, as described in more detail below.

Figure 12A:
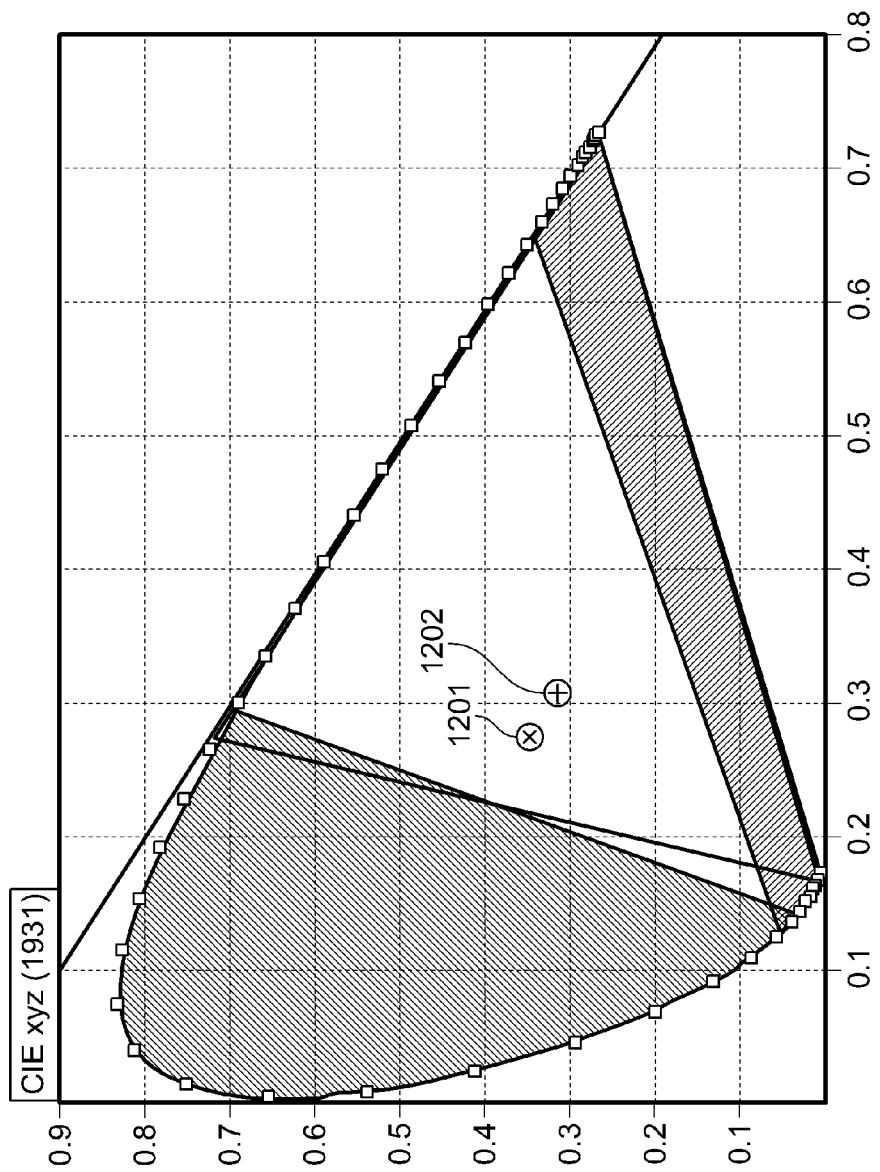
FIG. 12A illustrates a CIE 1931 color space chromaticity diagram produced by an AIMOD.
Figure 12B:
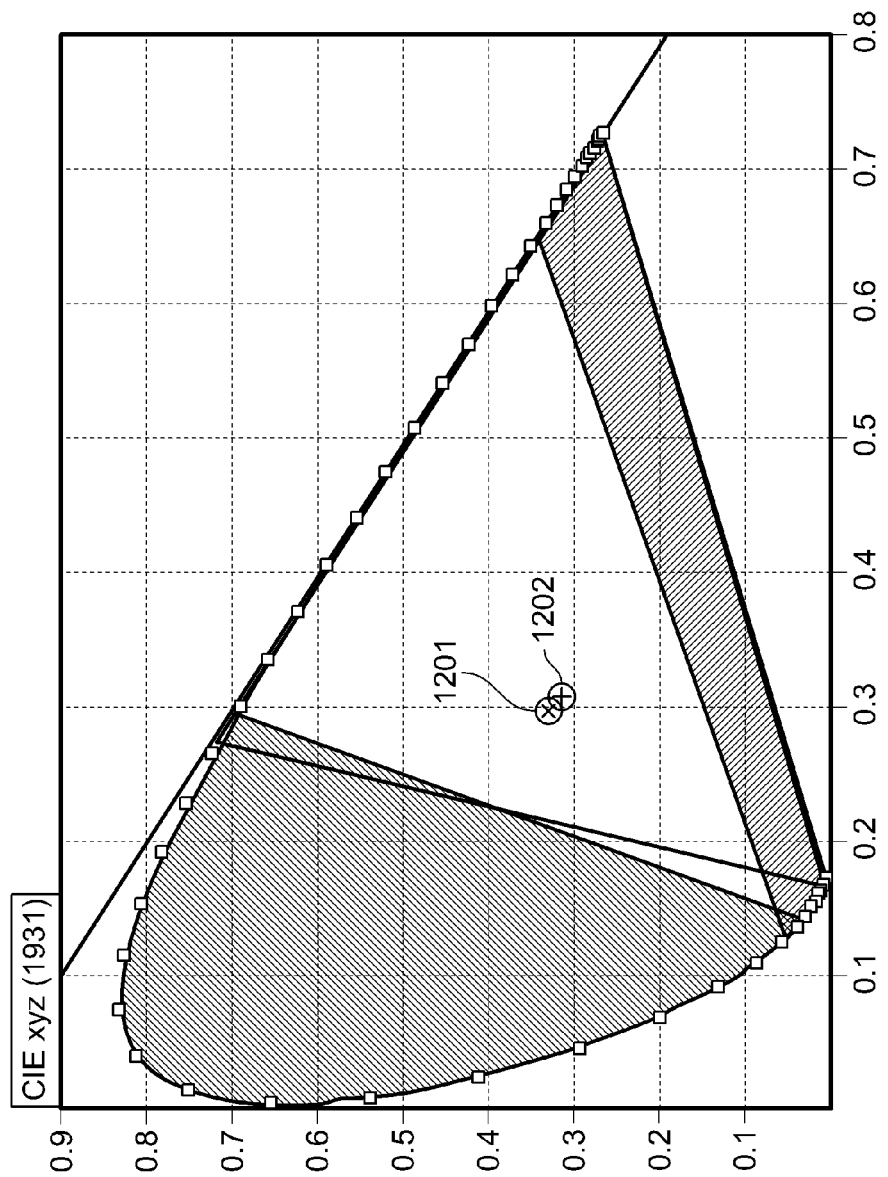
FIG. 12B illustrates a CIE 1931 color space chromaticity diagram produced by an AIMOD having a notch filter.

FIG. 12A illustrates a white state in CIE 1931 color space chromaticity diagram produced by an implementation of an AIMOD. In this example, the AIMOD does not include an additional color notch filter. FIG. 12B illustrates a white state in CIE 1931 color space chromaticity diagram produced by an implementation of an AIMOD having a notch filter. In each of FIGS. 12A and 12B, the encircled "x" 1201 designates the chromaticity coordinate of D65. As noted above, D65 is a standard illuminant value of white color for electronic displays, e.g., an LCD display. This reference is often used as an objective standard for "true white." The encircled "+" 1202 in FIG. 12A designates the chromaticity value of the white state of an AIMOD. As can be seen in the chromaticity diagram illustrated in FIG. 12A, there is noticeable separation between the chromaticity value of D65 and that of the white state of an AIMOD. This separation represents the degree to which the reflected color of the AIMOD in a white state deviates from D65, and therefore the degree to which it fails to reflect a "true white" color. With reference to FIG. 12B, the encircled "+" 1202 has a chromaticity value that is significantly closer to that of D65. The improved chromaticity value of 1202 illustrates the improved white state of an AIMOD having an appropriately color notch filter.

Figure 13A:
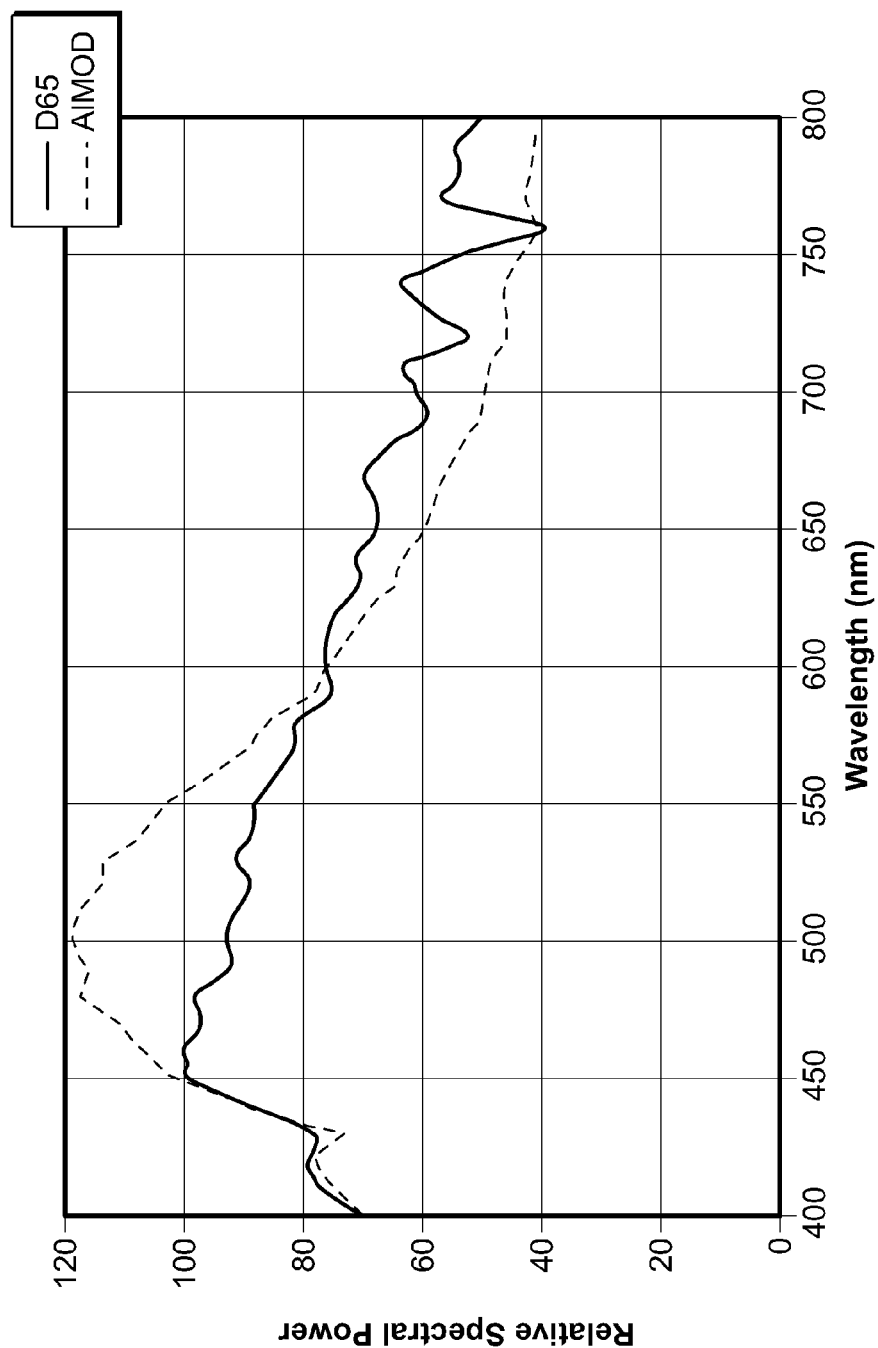
FIG. 13A illustrates a graph of the spectral power distribution of D65 and an AIMOD in a white state, according to one implementation.

FIG. 13A illustrates a graph of the spectral power distribution of D65 and an AIMOD in a white state, according to one implementation. As can be seen in the graph, the white state of an AIMOD spectrum deviates from that of D65. The largest deviation occurs between approximately 450 and 600 nm, in which the AIMOD white state spectrum exceeds that of D65. As a result of the increased prominence of these wavelengths, the AIMOD white state has a greenish tint. It should be noted that for purposes of comparison, the vertical axis is a relative value (unit-less). The power spectrum of the AIMOD white state have been shifted to most closely match the power spectrum of D65. As will be understood, since the vertical axis is a relative power spectrum values normalized for graphical representation, shifting the entire AIMOD spectrum does not detract from the demonstration of a tinted white state in the AIMOD.

Figure 13B:
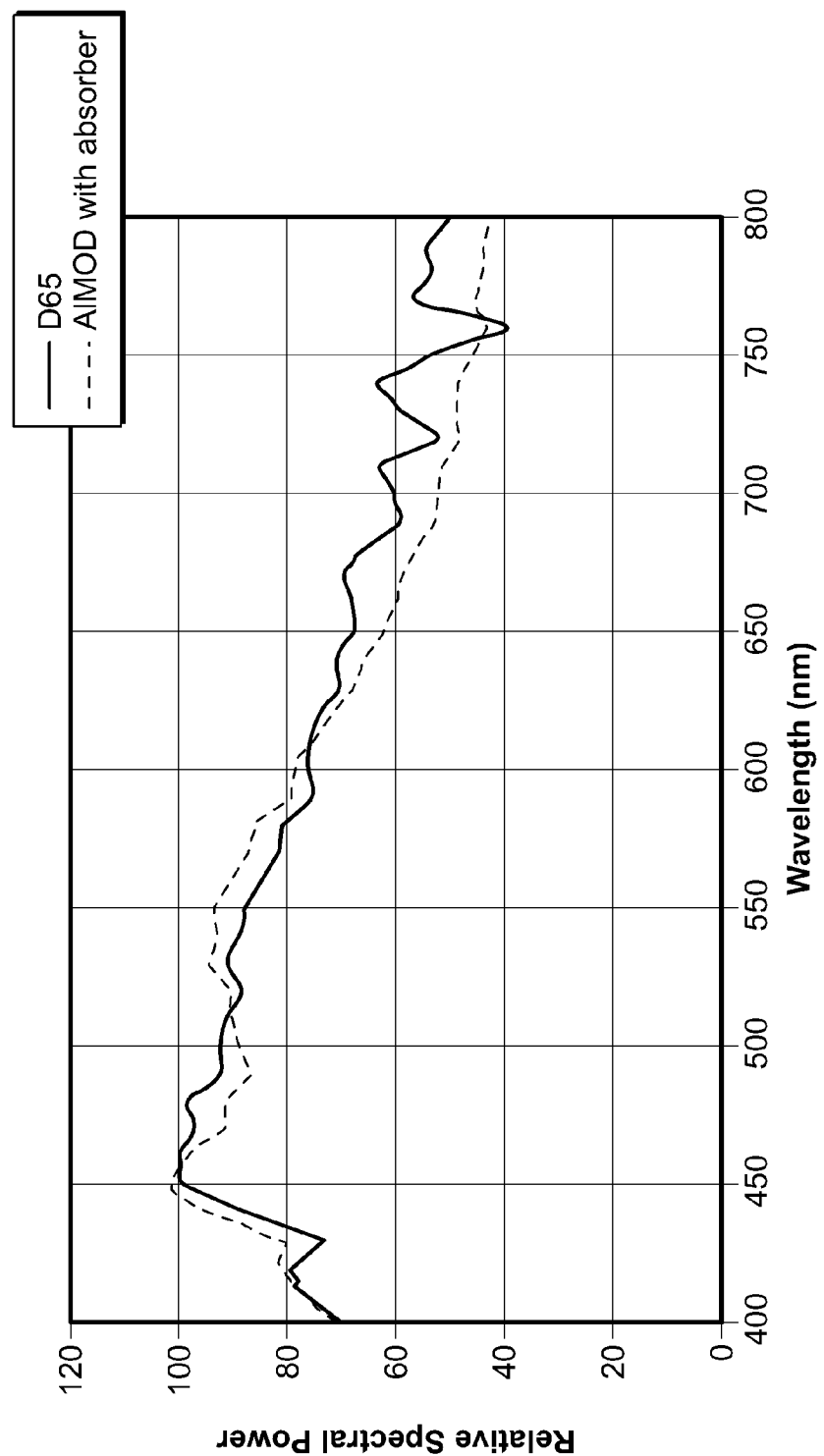
FIG. 13B illustrates a graph of the relative spectral power distributions of D65 and an AIMOD having a notch filter, according to one implementation.

FIG. 13B illustrates a graph of the relative spectral power distributions of D65 and an AIMOD having a notch filter, according to one implementation. As can be seen in the graph, the white state of the AIMOD having a color notch filter is characterized by a relative power spectrum that matches that of D65 far more closely than that of the AIMOD without a color notch filter. Accordingly, the incorporation of a color notch filter may substantially improve the appearance of the white state of an AIMOD, bringing it closer to the appearance of illuminant D65.

Figure 14:
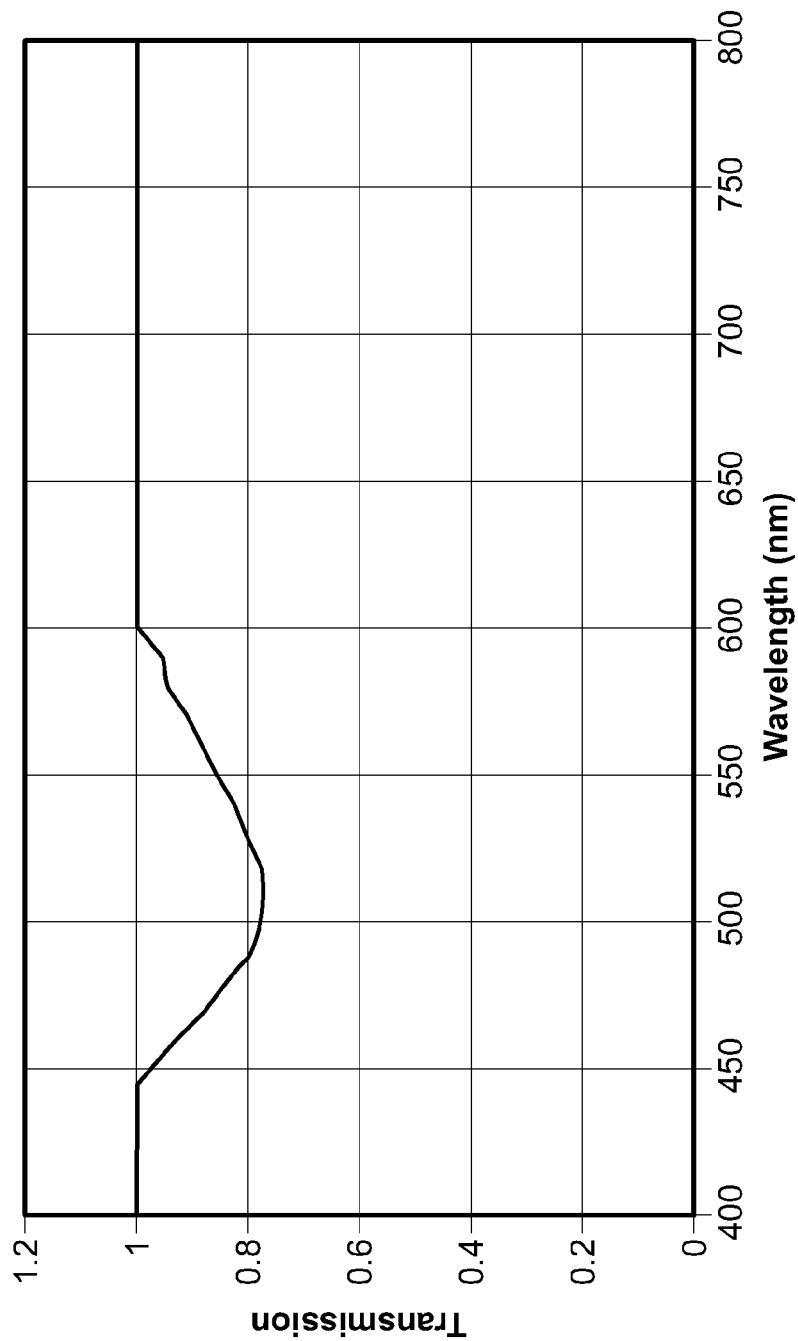
FIG. 14 illustrates a graph of the wavelength-dependent transmission characteristics of a notch filter, according to one implementation.

FIG. 14 illustrates a graph of the wavelength-dependent transmission characteristics of a notch filter, according to one implementation. As noted above with respect to FIG. 13A, the deviation in the power spectra of a standard AIMOD white state and that of illuminant D65 occurs primarily in wavelengths ranging from about 450 to 600 nm. To compensate for this effect, a color notch filter may be selected that operates primarily on these wavelengths. In some implementations, the notch filter may operate over a range of wavelengths between about 400 nm to about 600 nm. FIG. 14 illustrates the wavelength dependent transmission characteristics of an ideal color notch filter. As will be understood, these characteristics are "ideal" for an AIMOD having a white state power spectrum as illustrated in FIG. 13A. However, other AIMODs may be configured to produce white states with different tints. In other words, in other AIMODS, the largest deviation in its power spectrum from that of D65 may occur in other wavelength ranges. For example, an AIMOD that produces a bluish tinted white state will be characterized by a power spectrum that deviates from that of D65 in a lower wavelength range than that illustrated in FIG. 13A. Accordingly, for such an AIMOD, an "ideal" color notch filter would be configured to selectively filter wavelengths in that lower wavelength range, rather than in the range of approximately 450 to 600 nm, as illustrated in FIG. 14. In theory, the transmission coefficient of the notch filter can be calculated using the following equation:

$$T(\lambda) = A P_{D65}(\lambda)/P_{AIMOD}(\lambda) \qquad \text{Eq. (1)}$$

where, λ is wavelength, $P_{D65}(\lambda)$ is the power spectrum of D65 illumination, $P_{AIMOD}(\lambda)$ is the power spectrum of AIMOD without the application of a notch filter, and A is a normalization factor.

It will be understood that the color notch filter may be selected to reduce transmission of wavelengths in a given range. However, this reduction must be balanced against the need for producing color states other than white. For example, in implementations in which the AIMOD white state has a greenish tint, a color notch filter configured to reduce transmission of green wavelengths may be employed. While the use of this color notch filter may improve the appearance of the AIMOD white state, it also can affect the appearance of the AIMOD green state. In some implementations, for example, the color notch filter reduces the luminance of the green state by approximately 25% as compared to the AIMOD green state without using the color notch filter. As will be understood, the particular transmission characteristics of the color notch filter will vary depending on the desired application.

Although the discussion of the application of color notch filter is based on a 2-terminal device concept illustrated in FIG. 10 and FIG. 11, the same technique can be applied to the 3-terminal device of FIG. 9 because all the layers above the reflector (e.g., 906 in FIG. 9, and 1006 in FIG. 11) have no effect on optical/color performance.

Also, the discussions all refer to a standard white illuminant of D65; it is understood that a notch filter can be designed to match any type of white standard, such as D50 that is widely used for graphic arts and printed color illumination. For example, in order to obtain the white state that is identical to D50 illuminant, the transmission coefficient of the notch filter can be obtained in theory by replacing $P_{D65}(\lambda)$ in Equation (1) with $P_{D50}(\lambda)$.

Figure 15:
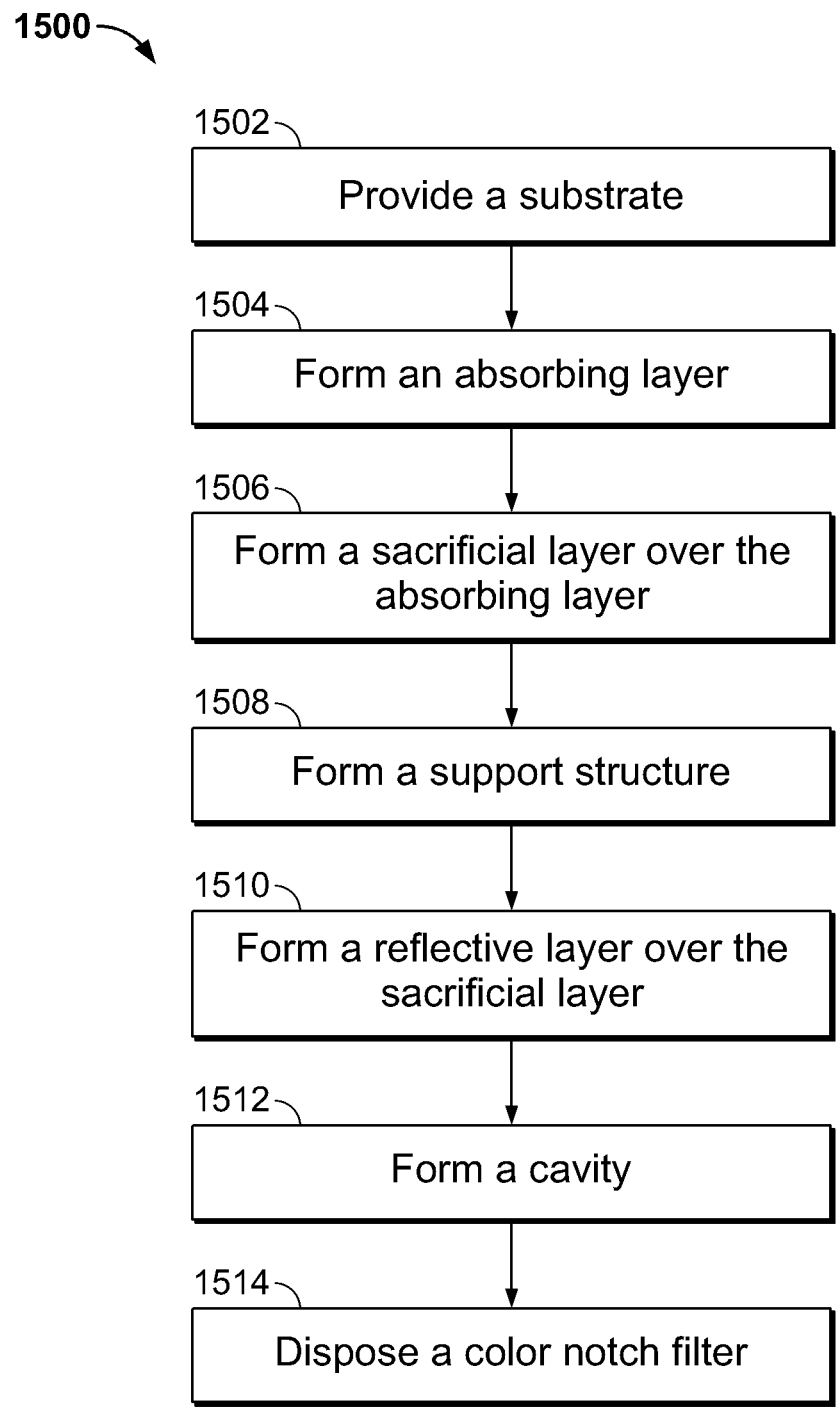
FIG. 15 shows an example of a flow diagram illustrating a method of manufacturing an AIMOD having a color notch filter.

FIG. 15 shows an example of a flow diagram illustrating a method of manufacturing an analog IMOD having a color notch filter. Process 1500 (FIG. 15) illustrates a manufacturing process for an analog IMOD that includes a color notch filter, such as the example implementation illustrated in FIG. 11A. Similar processes can be used to form the AIMOD implementations, for example, the implementations illustrated in FIGS. 9, 10 and 11B. The manufacturing process 1500 can include, but is not limited to, the manufacturing techniques and materials described in reference to FIGS. 8A-8E.

Referring to FIG. 15, in block 1502 process 1500 provides a substrate. In some implementations, the substrate may be made of glass or clear plastic. The process 1500 continues at block 1504 with the formation of an absorbing layer over the substrate. In some implementations, the absorbing layer can include MoCr or Vanadium, and the absorbing layer can have a thickness of between about 2 and 10 nm. In some implementations, one or more dielectric layers may be deposited onto the substrate prior to the formation of the absorbing layer. In some implementations, another dielectric layer may be formed over the absorbing layer after it is formed on the substrate, thereby creating an optical stack that includes two or more dielectric layers separated by the absorbing layer. The process 1500 continues at block 1506 with forming a sacrificial layer over the absorbing layer. In some implementations, deposition techniques such as PVD, PECVD, thermal CVD or spin-coating can be used to form the sacrificial layer. The process 1500 continues at block 1508 with the formation of a support structure. Such support structures can include a plurality of support structures, such as posts, that are disposed on one or more sides of a display element. The formation of the support structures can include patterning the sacrificial layer to form at least one support structure aperture, then depositing a material into the aperture to form the support structure.

The process 1500 continues at block 1510 with formation of a reflective layer over the sacrificial layer. In some implementations, one or more dielectric layers may be formed over the sacrificial layer prior to formation of the reflective layer. In some implementations, a mechanical layer may be formed over the reflective layer to provide for mechanical strength. In some implementations, the identical reflective layer and dielectric layer that are disposed on the bottom side of the mechanical layer may be formed on the top side of the mechanical layer to form a symmetrical structure. Such symmetrical structure prevents mechanical bending due to mismatch in the coefficients of thermal expansion (CTE) between the layers. In some implementations, connecting structures, such as hinges, may be formed to connect the mechanical layer to the support structures. In some other implementations, the reflective layer may directly contact and/or connect to the support structures.

The process 1500 continues at block 1512 with the formation of a cavity. The cavity can be formed by exposing the sacrificial layer to an etchant. During the process 1500, apertures that allow sacrificial layers to be exposed to an etchant also may be formed in the AIMOD. In some implementations, the reflective layer is formed to be movable as described herein following formation of the cavity, such that the height of the cavity can be correspondingly changed (increased or decreased) to affect the spectrum of wavelengths of light that are reflected by a display element. The process 1500 continues at block 1514 with disposing a color notch filter. In some implementations, the color notch filter may be arranged on a side of the substrate opposite the absorbing and reflective layers. In other implementations, the color notch filter may be arranged on the opposite side of the substrate, between the substrate and the reflective layer. In such implementations, the color notch filter may be disposed on the substrate prior to formation of the absorbing layer, or after formation of the absorbing layer but prior to formation of the sacrificial layer.

Figure 16A:
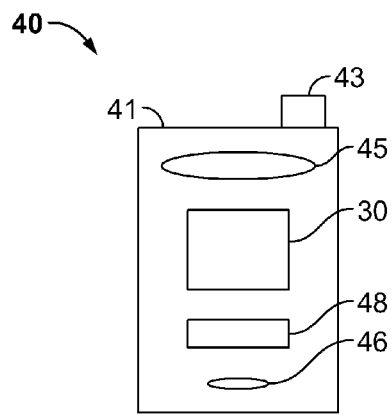
FIGS. 16A and 16B show examples of system block diagrams illustrating a display device that includes a plurality of IMODs.
Figure 16B:
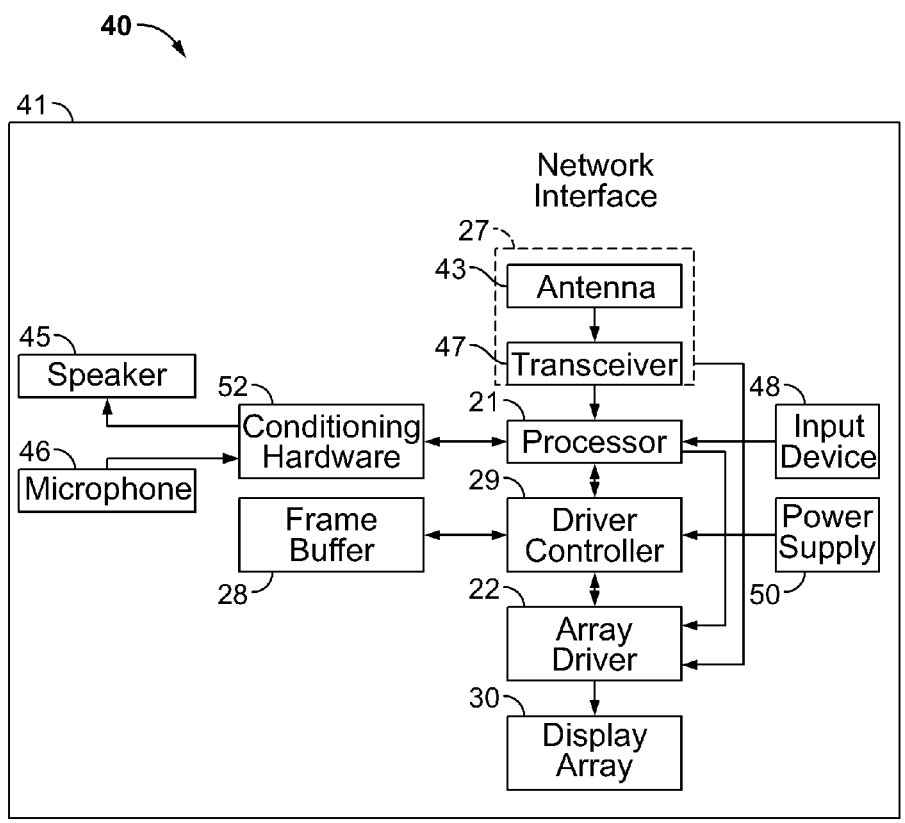

FIGS. 16A and 16B show examples of system block diagrams illustrating a display device 40 that includes a plurality of IMODs. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD or TFT LCD, or a non-flat-panel display, such as a CRT or other tube device. In addition, the display 30 can include an IMOD or an AIMOD display, as described herein.

The components of the display device 40 are schematically illustrated in FIG. 16B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b) and/or (g), or the IEEE 802.11 standard, including IEEE 802.11a, b, g and/or n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), NEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22 and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device, comprising:
an analog interferometric modulator (AIMOD) including
a substrate having a forward side that is exposed to receive incident light and a rearward side opposite the first side;
a first electrode disposed rearward of the substrate;
an absorber disposed rearward of the substrate;
a second electrode rearward of the first electrode and the absorber such that there is a cavity between the second electrode and the first electrode;
a reflective movable layer coupled to the second electrode, the movable layer configured to move to at least three different positions relative to the absorber in response to a voltage applied across the first electrode and the second electrode; and
a notch filter disposed forward of the movable layer and configured to at least partially absorb light having a wavelength between about 400 nm and about 600 nm.

2. The device of claim 1, wherein the movable layer includes a metal reflector and one or more dielectric layers disposed on the surface of the metal reflector nearest the absorber.

3. The device of claim 1, wherein the notch filter is disposed between the first electrode and the substrate.

4. The device of claim 1, wherein the notch filter is disposed between the first electrode and the cavity.

5. The device of claim 1, further comprising a cover glass disposed such that the substrate is between the cover glass and the movable layer, wherein the cover glass includes the notch filter.

6. The device of claim 1, wherein the notch filter includes at least one of:
a thin film dye, a plurality of metal nanoparticles, a Rugate filter and a holographic filter.

7. The device of claim 1, wherein the movable layer is configured to be positionable at a first distance from the absorber such that light reflected by the movable layer and the optical appears substantially white, and wherein the notch filter is positioned to receive incident light and receive the light reflected from the movable layer, and to at least partially absorb light having a wavelength between about 400 nm and about 600 nm.

8. The device of claim 1, wherein the notch filter is configured to decrease a difference in chromaticity between the reflective color of the AIMOD and that of illuminant D65, when the movable layer is positioned at a first distance from the optical stack that produces a reflection of light having a substantially white appearance.

9. The device of claim 8, wherein the first distance is between about 0 nm and about 20 nm.

10. The device of claim 1, wherein the absorber includes the first electrode.

11. The device of claim 1, wherein the reflective movable layer includes the second electrode.

12. The device of claim 1, further comprising:
a display that includes the AIMOD;
a processor that is configured to communicate with the display, the processor being configured to process image data; and
a memory device that is configured to communicate with the processor.

13. The device of claim 12, further comprising:
a driver circuit configured to send at least one signal to the display; and
a controller configured to send at least a portion of the image data to the driver circuit.

14. The device of claim 13, further comprising:
an image source module configured to send the image data to the processor, wherein the image source module includes at least one of a receiver, transceiver and transmitter.

15. The device of claim 13, further comprising:
an input device configured to receive input data and to communicate the input data to the processor.

16. A device, comprising:
a means for modulating light including
a substrate having a forward side that is exposed to receive incident light and a rearward side opposite the first side;
a first means for conducting electrostatic charge, the first conducting means disposed rearward of the substrate;
a first means for absorbing light disposed rearward of the substrate;
a second means for conducting electrostatic charge, the second conducting means being positioned rearward of the first conducting means and the first absorbing means, such that there is a cavity between the second conducting means and the first conducting means;
a means for reflecting light, the reflecting means coupled to the second conducting means, the reflecting means configured to move to at least three different positions relative to the first absorbing means in response to a voltage applied across the first conducting means and the second conducting means; and
a second means for absorbing light disposed forward of the reflecting means and configured to at least partially absorb light having a wavelength between about 400 nm and about 600 nm.

17. The device of claim 16, wherein the first conducting means includes a stationary first electrode, wherein the second conducting means includes a movable second electrode, wherein the first absorbing means includes an optical stack having an absorbing layer, wherein the reflecting means includes a reflective movable layer, and wherein the second absorbing means includes a notch filter.

18. The device of claim 16, wherein the second absorbing means includes at least one of a thin film dye, a plurality of metal nanoparticles, a Rugate filter and a holographic filter.

19. A method of manufacturing a device, comprising:
providing a substrate having a forward side that is exposed to receive incident light and a rearward side opposite the first side;
disposing a stationary first electrode rearward of the substrate;
disposing an absorber rearward of the substrate;
disposing a reflective movable layer and a second electrode rearward of the first electrode and the absorber;
forming a cavity between the second electrode and the first electrode, wherein the movable layer is configured to move in the cavity to at least three different positions relative to the optical stack in response to a voltage applied across the first electrode and the second electrode; and
disposing a notch filter forward of the movable layer as the substrate, wherein the notch filter is configured to at least partially absorb light having a wavelength between about 400 nm and about 600 nm.

20. The method of claim 19, wherein disposing the notch filter includes arranging the notch filter between the first electrode and the substrate.

21. The method of claim 19, further comprising disposing a cover glass over the first side of the substrate, and wherein disposing the notch filter includes arranging the notch filter on the cover glass.

22. The method of claim 19, wherein the notch filter includes at least one of: a thin film dye, a plurality of metal nanoparticles, a Rugate filter and a holographic filter.

23. The method of claim 19, wherein the movable layer is configured to be positionable at a first distance from the absorber such that light reflected by the movable layer appears substantially white, and wherein the notch filter is positioned to receive light reflected from the movable layer and to absorb light having a wavelength between about 400 nm and about 600 nm.

24. The method of claim 23, wherein the first distance is between about 0 nm and about 20 nm.

25. The method of claim 19, wherein the notch filter is configured to decrease a difference in chromaticity between the reflective color of the device and that of illuminant D65, when the movable layer is positioned at a first distance from the absorber that produces a reflection of light having a substantially white appearance.

* * * * *